(12) United States Patent
Chen et al.

(10) Patent No.: US 9,343,442 B2
(45) Date of Patent: May 17, 2016

(54) PASSIVE DEVICES IN PACKAGE-ON-PACKAGE STRUCTURES AND METHODS FOR FORMING THE SAME

(71) Applicant: Taiwan Semiconductor Manufacturing Company, Ltd., Hsin-Chu (TW)

(72) Inventors: Chih-Hua Chen, Jhubei (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 451 days.

(21) Appl. No.: 13/623,441

(22) Filed: Sep. 20, 2012

(65) Prior Publication Data

US 2014/0076617 A1    Mar. 20, 2014

(51) Int. Cl.

| | |
|---|---|
| H01L 25/16 | (2006.01) |
| H01L 25/10 | (2006.01) |
| H01L 23/64 | (2006.01) |
| H01L 21/683 | (2006.01) |
| H01L 23/498 | (2006.01) |
| H01L 23/538 | (2006.01) |
| H01L 23/31 | (2006.01) |
| H01L 21/56 | (2006.01) |

(52) U.S. Cl.
CPC ............ *H01L 25/16* (2013.01); *H01L 21/6835* (2013.01); *H01L 23/49816* (2013.01); *H01L 23/49822* (2013.01); *H01L 23/49827* (2013.01); *H01L 23/5389* (2013.01); *H01L 23/645* (2013.01); *H01L 25/105* (2013.01); *H01L 21/568* (2013.01); *H01L 23/3128* (2013.01); H01L 2224/03002 (2013.01); H01L 2224/0401 (2013.01); H01L 2224/04105 (2013.01); H01L 2224/06181 (2013.01); H01L 2224/11002 (2013.01); H01L 2224/12105 (2013.01); H01L 2224/131 (2013.01); H01L 2224/14181 (2013.01); H01L 2224/16238 (2013.01); H01L 2224/73204 (2013.01); H01L 2224/73267 (2013.01); H01L 2225/1035 (2013.01); H01L 2225/1041 (2013.01); H01L 2225/1058 (2013.01); H01L 2924/15311 (2013.01); H01L 2924/18162 (2013.01); H01L 2924/19042 (2013.01); H01L 2924/19104 (2013.01); Y10T 29/4913 (2015.01); Y10T 29/4916 (2015.01); Y10T 29/49144 (2015.01)

(58) Field of Classification Search
USPC .......................................................... 257/687
See application file for complete search history.

(56) References Cited

U.S. PATENT DOCUMENTS

| | | | | |
|---|---|---|---|---|
| 3,988,764 | A * | 10/1976 | Cline ................. | H01F 17/0006 257/45 |
| 6,031,284 | A * | 2/2000 | Song ............................. | 257/701 |
| 6,240,622 | B1 * | 6/2001 | Ahn et al. ........................ | 29/604 |

(Continued)

FOREIGN PATENT DOCUMENTS

| | | |
|---|---|---|
| CN | 101221947 | 7/2008 |
| JP | 2003203982 | 7/2003 |

*Primary Examiner* — Timothy Thompson
*Assistant Examiner* — Krystal Robinson
(74) *Attorney, Agent, or Firm* — Slater Matsil, LLP (57) ABSTRACT

A device includes a polymer. A device die is disposed in the polymer. A passive device includes three Through Assembly Vias (TAVs) penetrating through the polymer, wherein the TAVs are coupled in series. A Redistribution Line (RDL) is underlying the polymer. The RDL electrically couples a first one of the TAVs to a second one of the TAVs.

20 Claims, 13 Drawing Sheets

(56) References Cited

U.S. PATENT DOCUMENTS

| | | | |
|---|---|---|---|
| 6,531,945 B1* | 3/2003 | Ahn et al. | 336/200 |
| 6,992,557 B2* | 1/2006 | Aoyagi | 336/200 |
| 7,196,607 B2* | 3/2007 | Pleskach | H01F 17/0033 257/E23.062 |
| 2002/0097129 A1* | 7/2002 | Johnson | 336/200 |
| 2003/0141529 A1 | 7/2003 | Seto et al. | |
| 2004/0033654 A1* | 2/2004 | Yamagata | 438/202 |
| 2008/0135977 A1* | 6/2008 | Meyer | H01L 24/82 257/531 |
| 2008/0246126 A1* | 10/2008 | Bowles et al. | 257/659 |
| 2009/0140394 A1* | 6/2009 | Bathan et al. | 257/621 |
| 2010/0289126 A1 | 11/2010 | Pagaila et al. | |
| 2014/0252595 A1 | 9/2014 | Yen et al. | |

\* cited by examiner

Fig. 13 though the two carriers are on opposite sides of package

PASSIVE DEVICES IN PACKAGE-ON-PACKAGE STRUCTURES AND METHODS FOR FORMING THE SAME

BACKGROUND

Passive devices such as inductors, transformers, transmission lines, or the like are commonly used in Radio Frequency (RF) applications. The passive devices may be embedded in System-on-Chip (SoC) applications. The performance of the passive devices, such as the Q factors, however, is low due to the Eddy currents generated in the nearby silicon substrates. The passive devices may also be formed on glass substrates, or in the fan-out structures of device dies when the device dies are packaged. The results, however, are still not satisfactory.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Package-on-Package (PoP) structure with a passive device formed therein and the methods of forming the same are provided in accordance with various exemplary embodiments. The intermediate stages of forming the PoP structure are illustrated. The variations of the embodiments are discussed. Throughout the various views and illustrative embodiments, like reference numbers are used to designate like elements.

Figure 1:
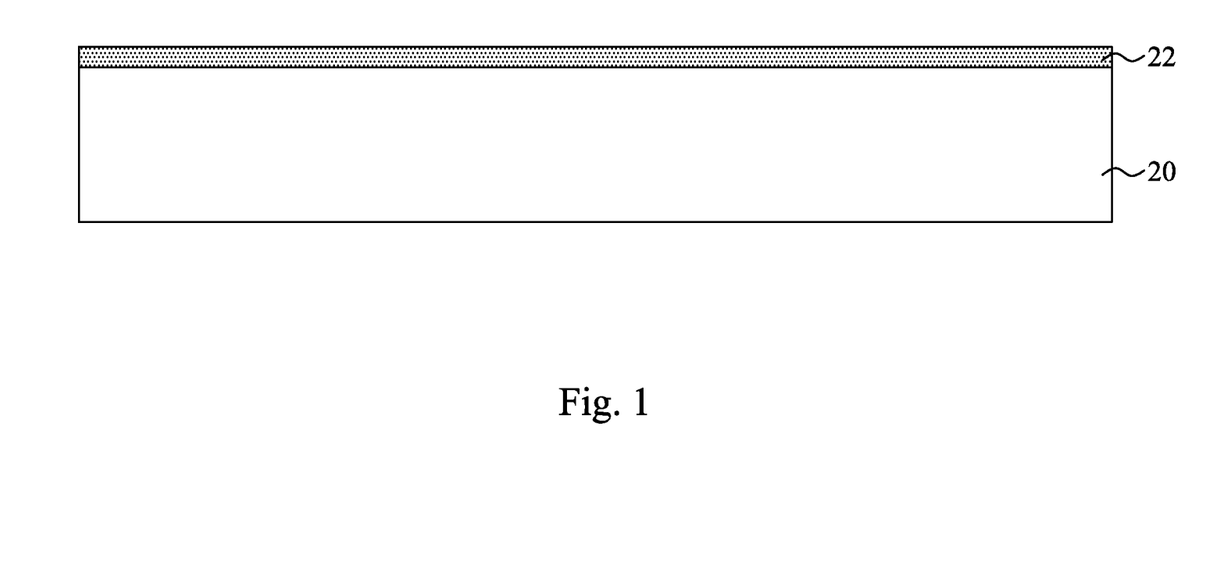
FIGS. 1 through 10 are cross-sectional views of intermediate stages in the manufacturing of a Package-on-Package (PoP) structure in accordance with some exemplary embodiments.

FIGS. 1 through 10 are cross-sectional views of intermediate stages in the manufacturing of a PoP structure in accordance with some exemplary embodiments. FIG. 1 illustrates carrier 20 and adhesive layer 22 on carrier 20. Carrier 20 may be a glass carrier, a ceramic carrier, or the like. Adhesive layer 22 may be formed of an adhesive such as an Ultra-Violet (UV) glue.

Figure 2:
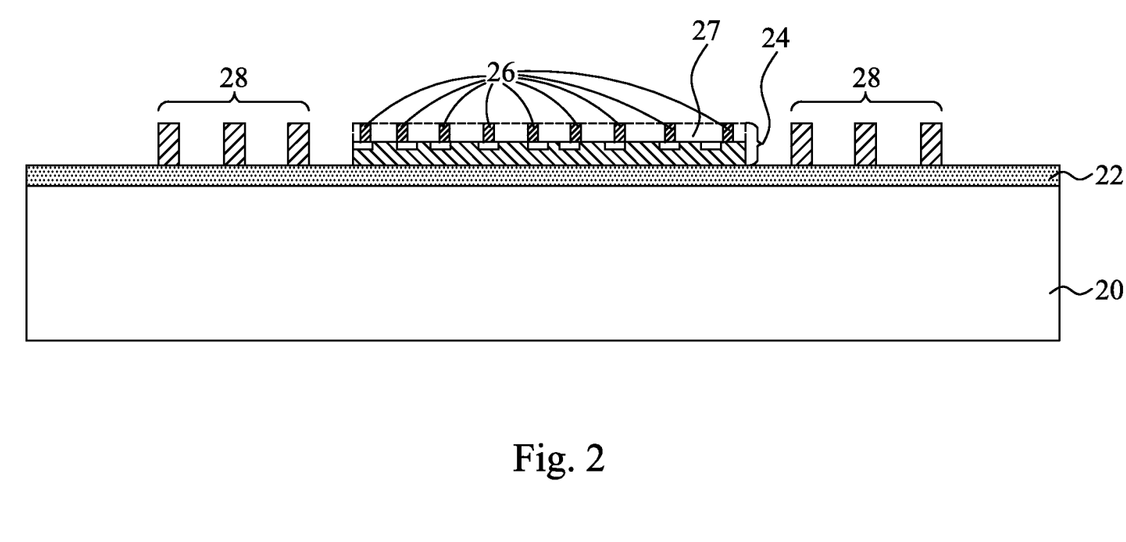

As shown in FIG. 2, package component 24 and conductive posts 28 are placed or formed on adhesive layer 22. Throughout the description, conductive posts 28 are alternatively referred to as Through Assembly Vias (TAVs) 28. The positions of package component 24 and TAVs 28 are aligned to desirable locations, so that subsequently formed redistribution lines may electrically couple to, and form passive device 64 (FIGS. 10 and 12) with, TAVs 28. In some embodiments, package component 24 includes a device die, which may be a logic die, a memory die, or the like. The device die may also include active devices (not shown) such as transistors, and passive devices (not shown) such as resistors, capacitors, or the like. Package component 24 may also be a package that includes a device die, an interposer, a package substrate (not shown), and/or the like.

In some exemplary embodiments, metal posts 26 (such as copper posts) are formed as a top portion of package component 24, and are electrically coupled to the devices in package component 24. In some embodiments, dielectric layer 27 is formed at the top surface of package component 24, with metal posts 26 having at least lower portions in dielectric layer 27. The top surface of dielectric layer 27 may be substantially level with the top ends of metal posts 26. Alternatively, metal posts 26 protrude above remaining portions of package component 24.

TAVs 28 may include stud bumps and bond wires attached to the stud bumps. TAVs 28 may be formed over adhesive layer 22, or formed elsewhere and placed over adhesive layer 22. In an exemplary process for forming one of TAVs 28, a wire bonding is performed to form a stud bump, then the wire is cut. A portion of the bond wire is left attached to the stud bump, and the leftover bond wire and the stud bump in combination form TAV 28. The material of TAVs 28 may include copper, aluminum, or the like. In the resulting structure in FIG. 2, the bottom ends of TAVs 28 are substantially level with the bottom surface of package component 24.

Figure 3:
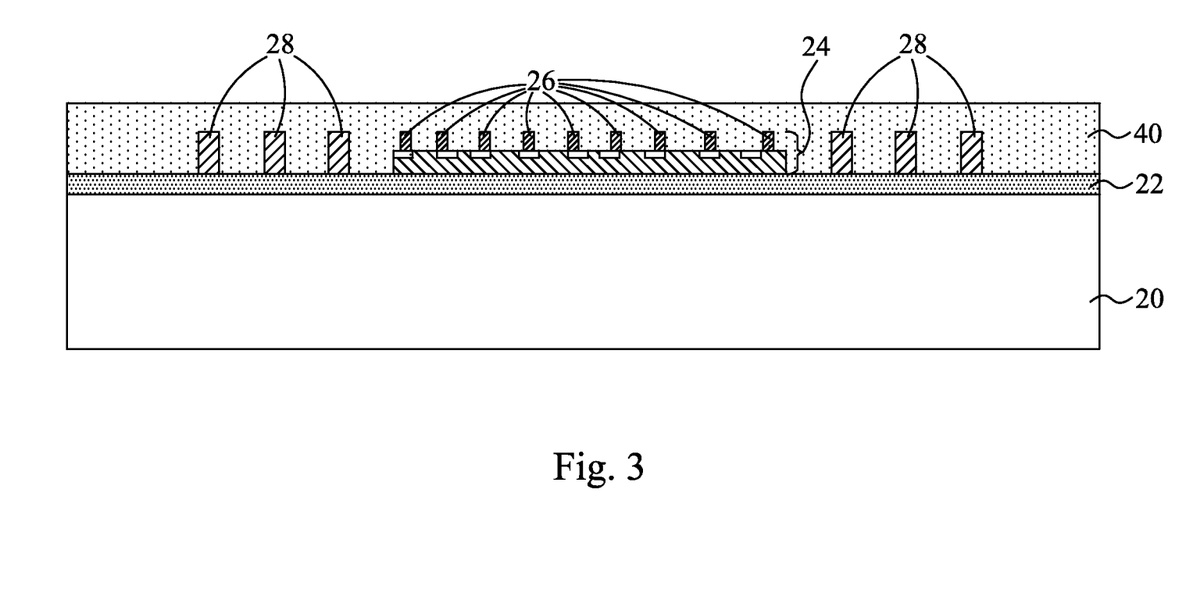
Figure 4:
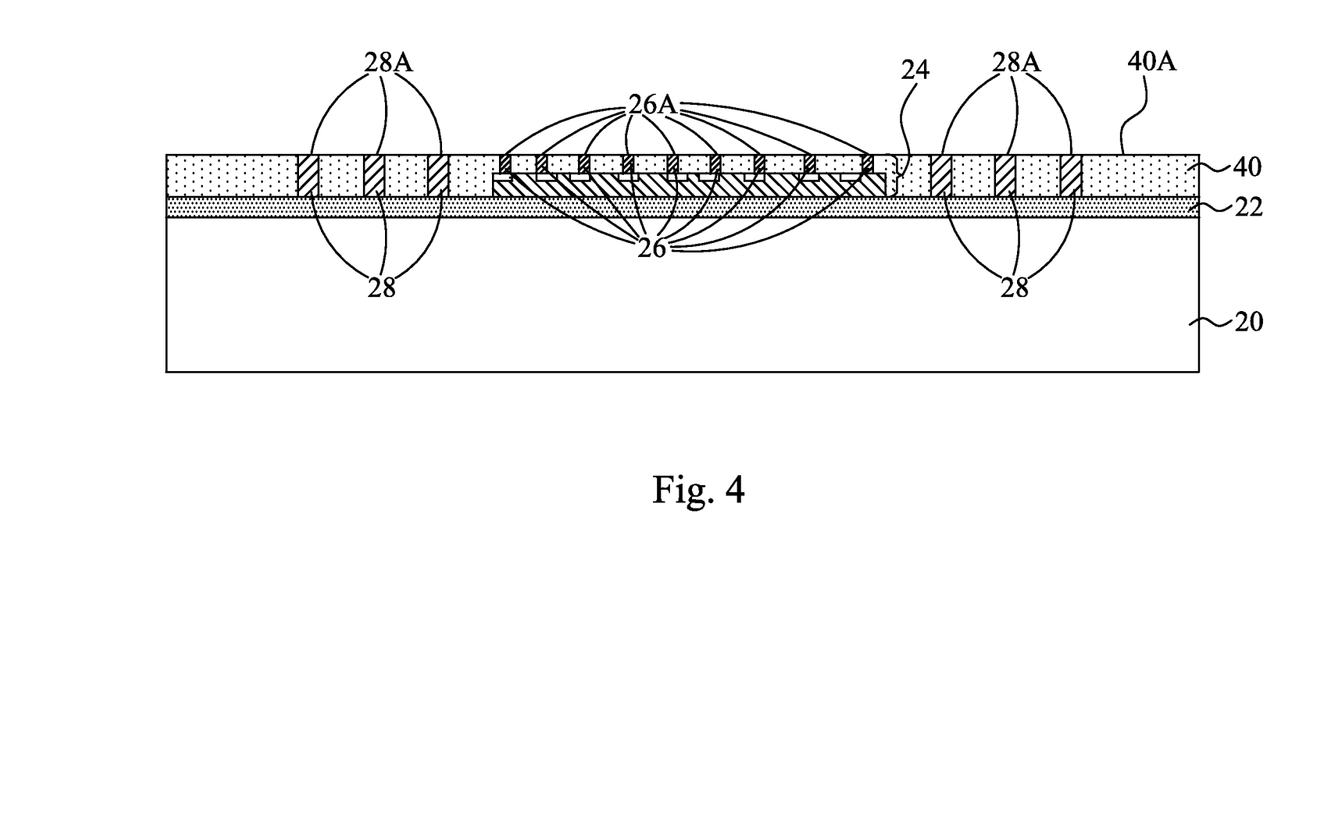

Referring to FIG. 3, polymer 40 is molded on package component 24 and TAVs 28. Polymer 40 fills the gaps between package component 24 and TAVs 28, and may be in contact with adhesive layer 22. Furthermore, polymer 40 is filled into the gaps between metal posts 26. Polymer 40 may include a molding compound, a molding underfill, or a kind of epoxy. The top surface of polymer 40 is higher than the top ends of metal posts 26 and TAVs 28. Next, a thinning step, which may be a grinding step, is performed to thin polymer 40, until metal posts 26 and TAVs 28 are exposed. The resulting structure is shown in FIG. 4. Due to the step of thinning, the top ends 28A of TAVs 28 are substantially level with the top ends 26A of metal posts 26, and are substantially level with top surface 40A of polymer 40.

Figure 5:
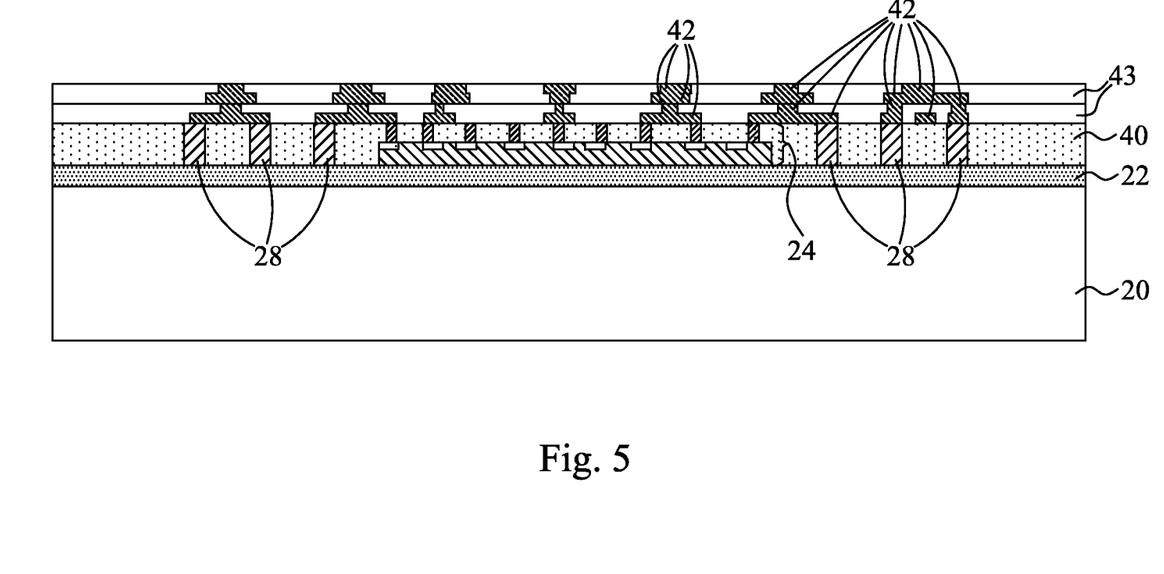

Next, referring to FIG. 5, Redistribution Lines (RDLs) 42 are formed over polymer 40 to connect to metal posts 26 and TAVs 28, and interconnect metal posts 26 and TAVs 28. RDLs 42 are formed in dielectric layers 43. In some embodiments, RDLs 42 are formed by depositing metal layers, and then patterning the metal layers. In alternative embodiments, RDLs 42 and dielectric layers 43 are formed using damascene processes. RDLs 42 may comprise aluminum, copper, tungsten, and/or alloys thereof. Some of RDLs 42 may also comprise a paramagnetic material, which may comprise iron, cobalt, nickel, or combinations thereof.

Figure 6:
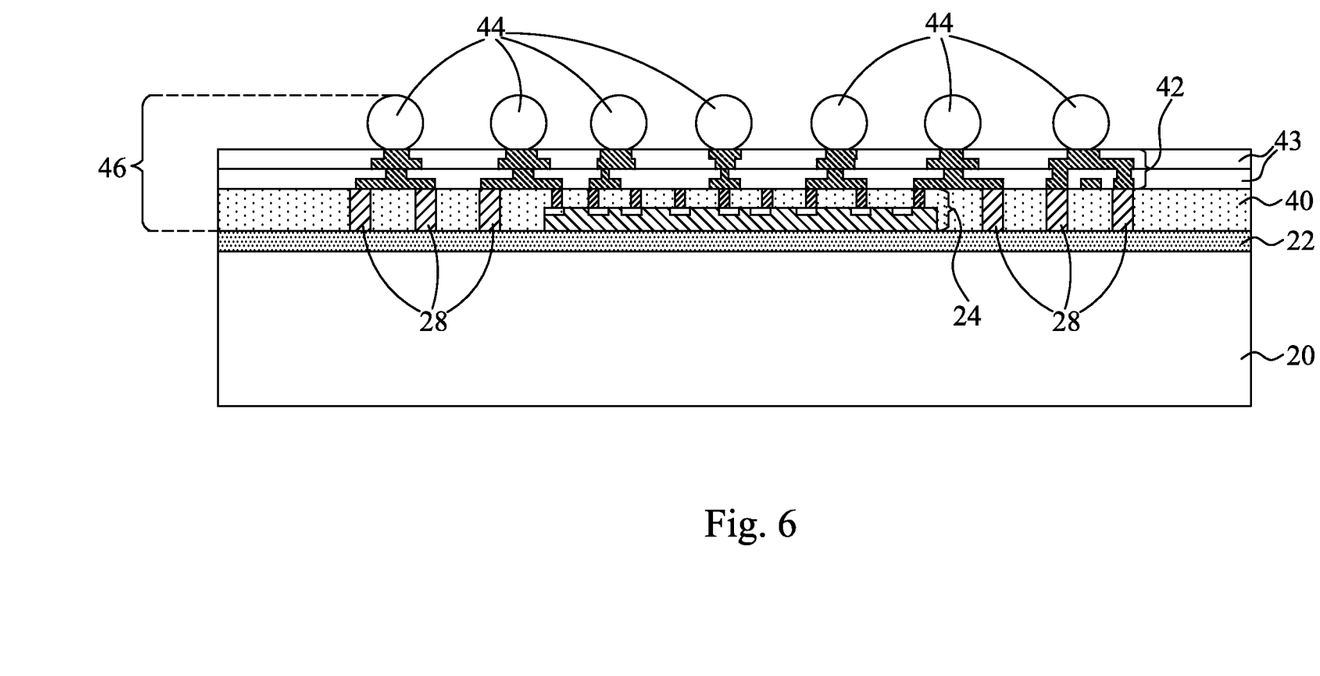

FIG. 6 illustrates the formation of electrical connectors 44. In some exemplary embodiments, the formation of connectors 44 includes placing solder balls on the exposed portions of RDLs 42, and then reflowing the solder balls. In alternative embodiments, the formation of connectors 44 includes performing a plating step to form solder regions on RDLs 42, and then reflowing the solder regions. Connectors 44 may also include metal pillars, or metal pillars and solder caps, which may also be formed through plating. Throughout the description, the combined structure including package component 24, TAVs 28, and polymer 40 is referred to as package 46.

Figure 7:
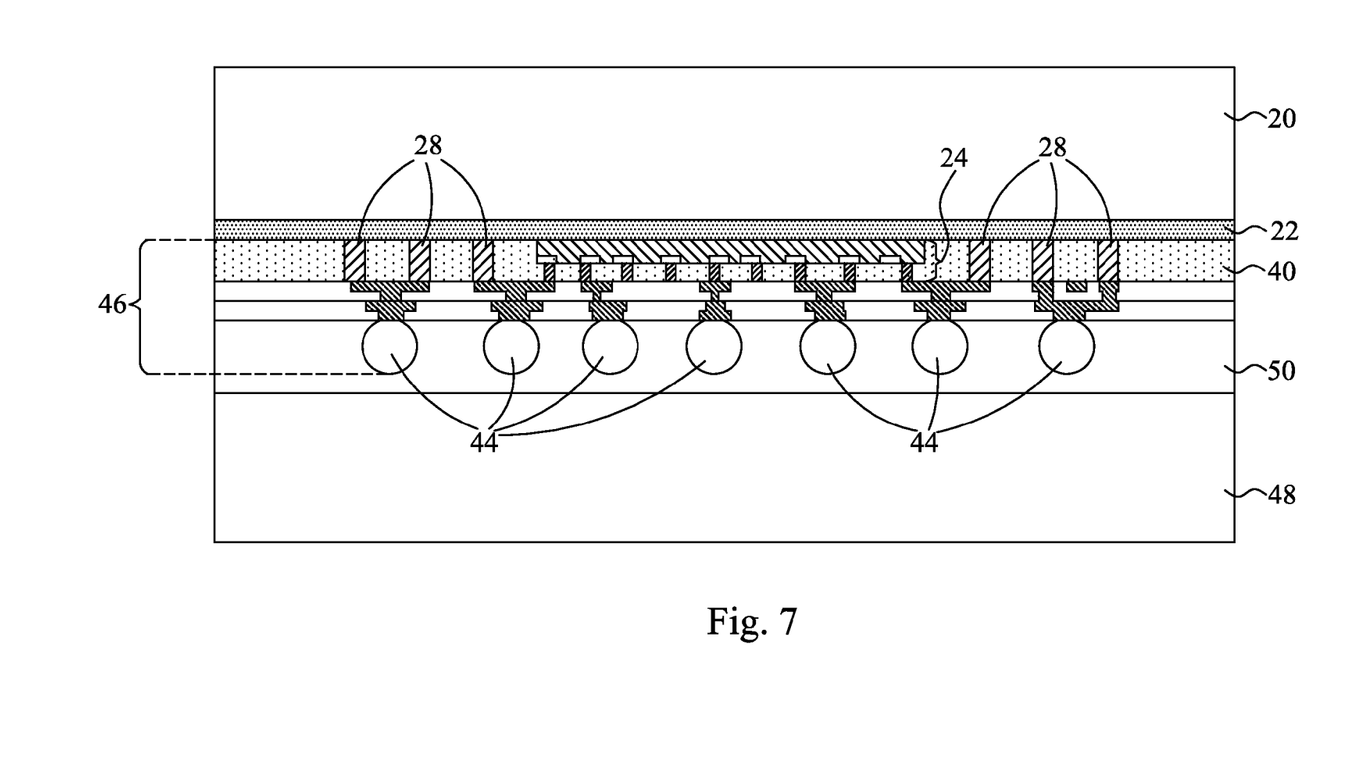

Referring to FIG. 7, a carrier switch is performed. In the carrier switch process, carrier 48 is first attached to package 46, wherein carriers 20 and 48 are on opposite sides of package 46. Carrier 48 may be attached to package 46 through adhesive 50, which may be a UV glue, a tape, or the like.

Carrier 20 is then detached from package 46 by causing adhesive layer 22 to lose adhesion. Adhesive layer 22 is then removed. For example, when adhesive layer 22 is formed of the UV glue, adhesive layer 22 may be exposed to UV light, so that adhesive layer 22 loses adhesion, and hence carrier 20 and adhesive layer 22 can be removed from package 46.

Figure 8:
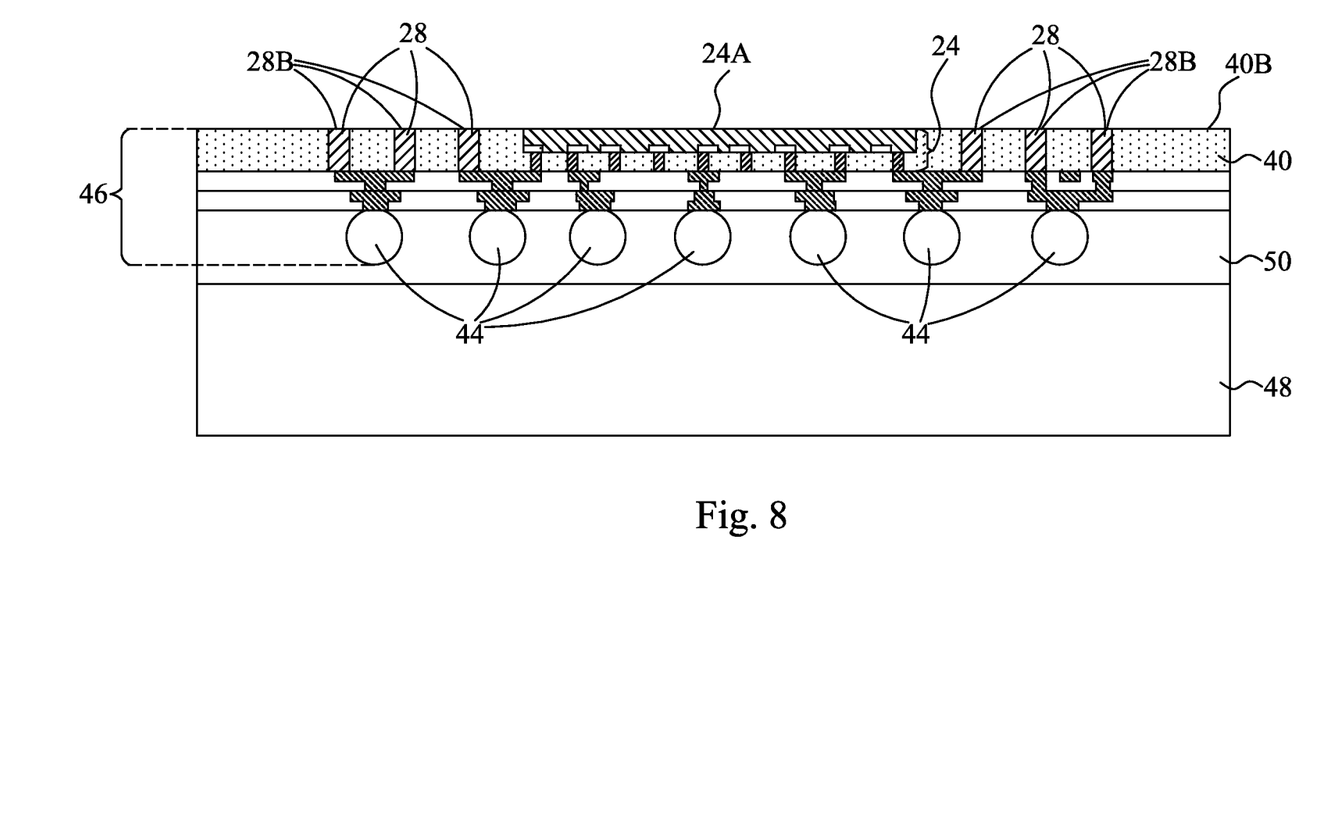

Referring to FIG. 8, after the carrier switch, the back ends 28B of TAVs 28 are exposed. In the illustrated structure, ends 28B of TAVs 28 are level with back surface 24A of package component 24. Ends 28B of TAVs 28 may also be substantially level with surface 40B of polymer 40. In some embodiments, a grinding is performed to lightly grind the back surface of package component 24 and TAVs 28, so that TAVs 28 protrude above the back surface of package component 24. Alternatively, the grinding step is skipped.

Figure 9:
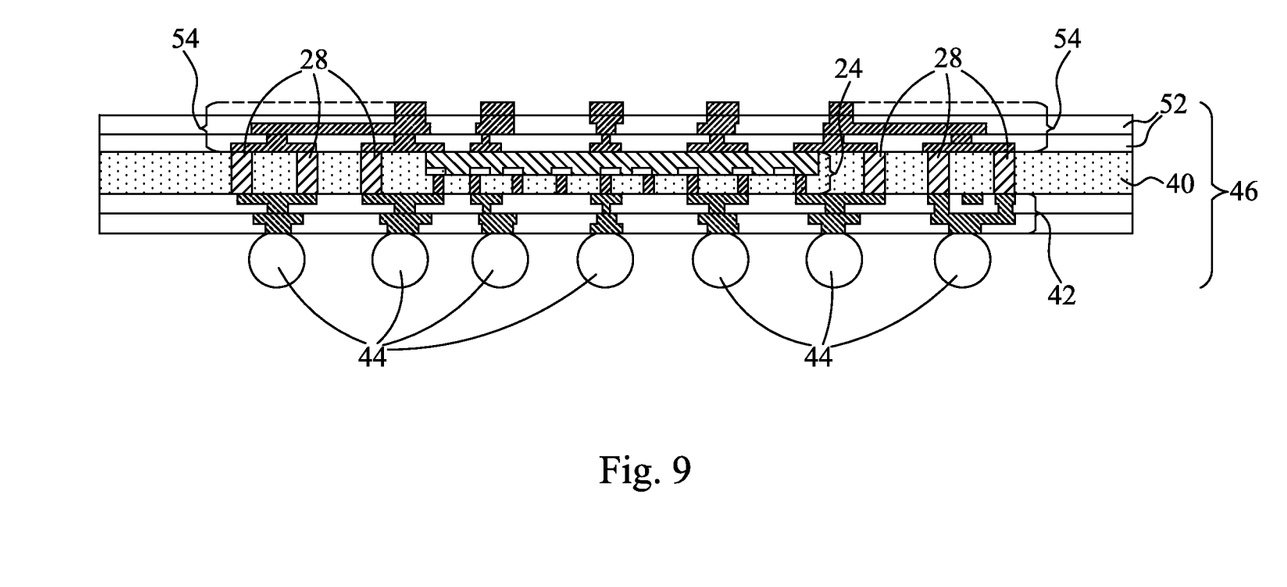

As shown in FIG. 9, dielectric layers 52 and RDLs 54 are formed on the illustrated top surface of package 46. In some embodiments, dielectric layers 52 include polymers, which may be polyimide, benzocyclobutene (BCB), or the like. Dielectric layers 52 may be formed of a light-sensitive material such as polyimide, which may be exposed in a lithography step, and then patterned. Alternatively, dielectric layers 52 may be formed of other materials such as oxides, nitrides, carbides, carbon nitrides, combinations thereof, and multilayers thereof. RDLs 54 are formed in dielectric layer 52 and connected to TAVs 28. RDLs 54 may extend over and aligned to package component 24. Accordingly, RDLs 54 have a fan-in structure. The portions of RDLs 54 that are over and aligned to package component 24 may be connected to the portions of RDLs that are over and aligned to TAVs 28. Next, carrier 48 (FIG. 8) is demounted from package 46. The formation of package 46 is thus finished.

Figure 10:
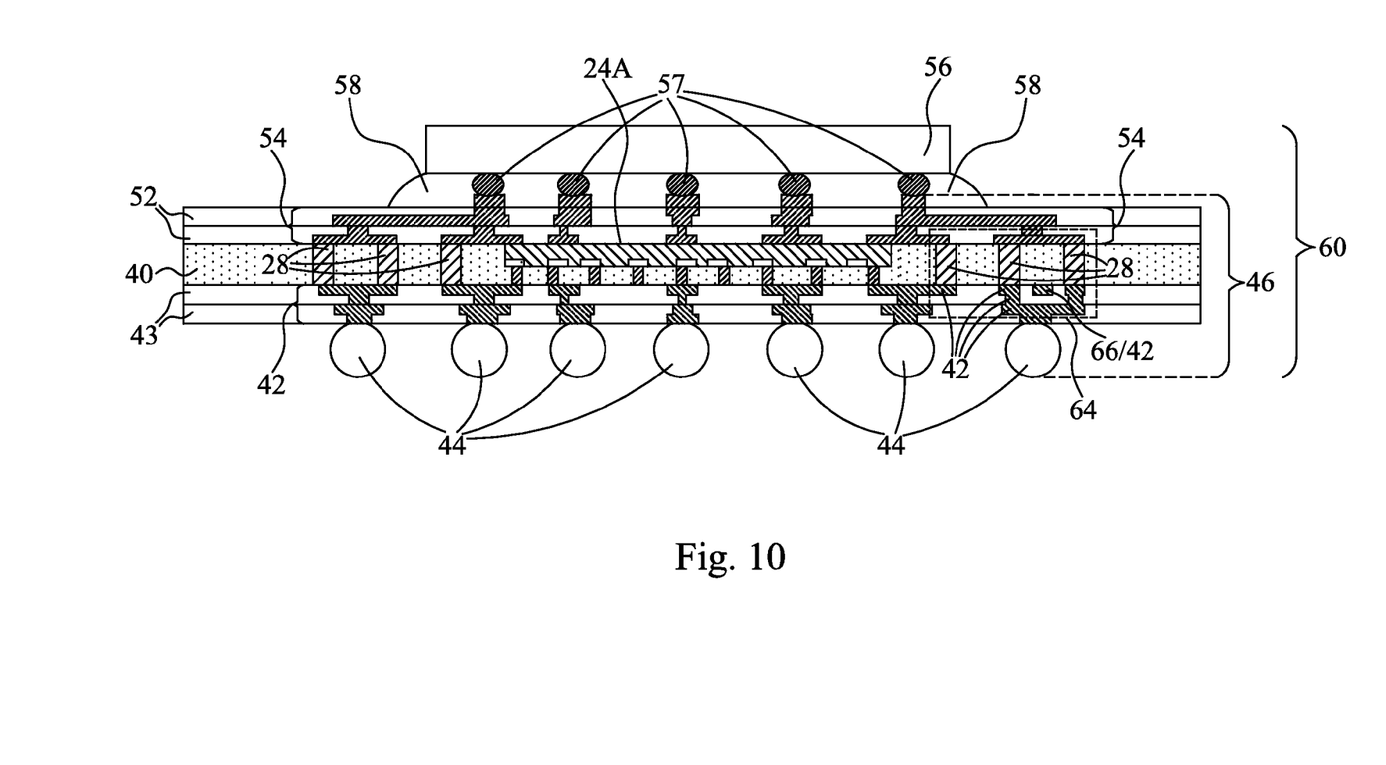

Referring to FIG. 10, package 46 is bonded to top package component 56 to form PoP structure 60. Package component 56 may comprise a device die, an interposer, a package substrate, or combinations thereof. The bonding is performed through connectors 57, which may be, for example, solder balls. Polymer 58 is dispensed between package 46 and package component 56. Polymer 58 may be an underfill or a molding underfill. Alternatively, PoP structure 60 is molded with a molding compound or a molding underfill.

Figure 11:
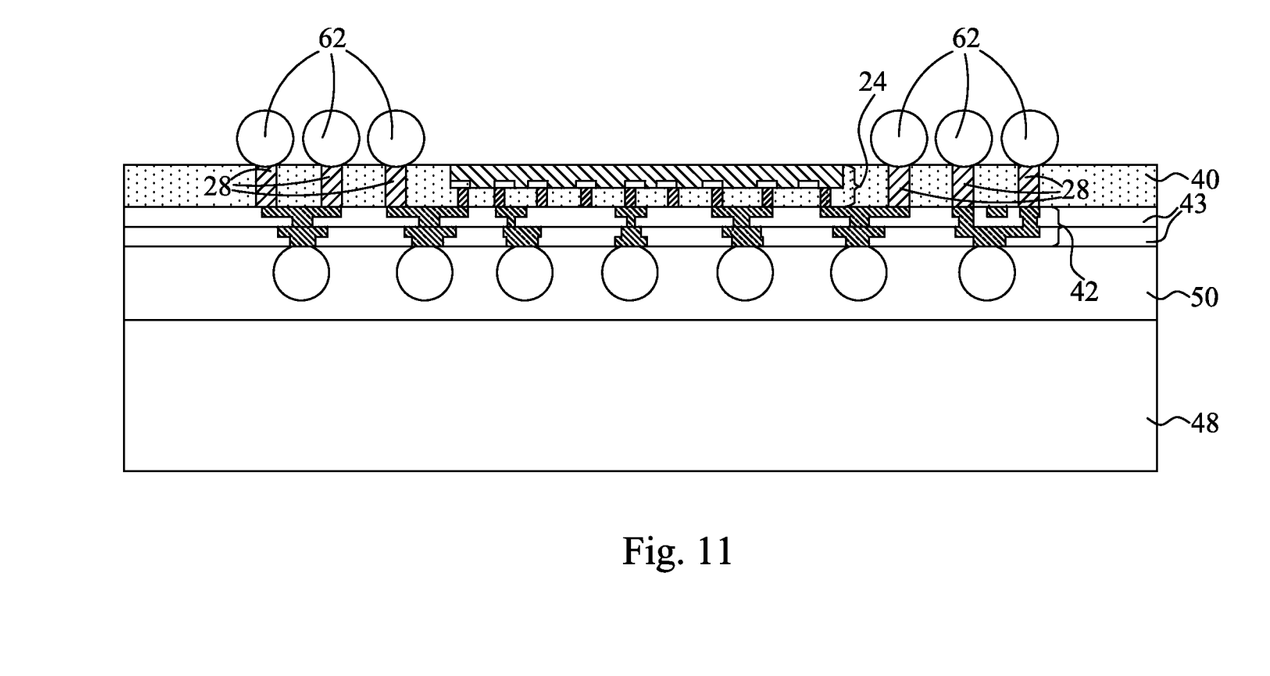
FIGS. 11 and 12 illustrate cross-sectional views of intermediate stages in the manufacturing of a PoP structure in accordance with alternative embodiments.
Figure 12:
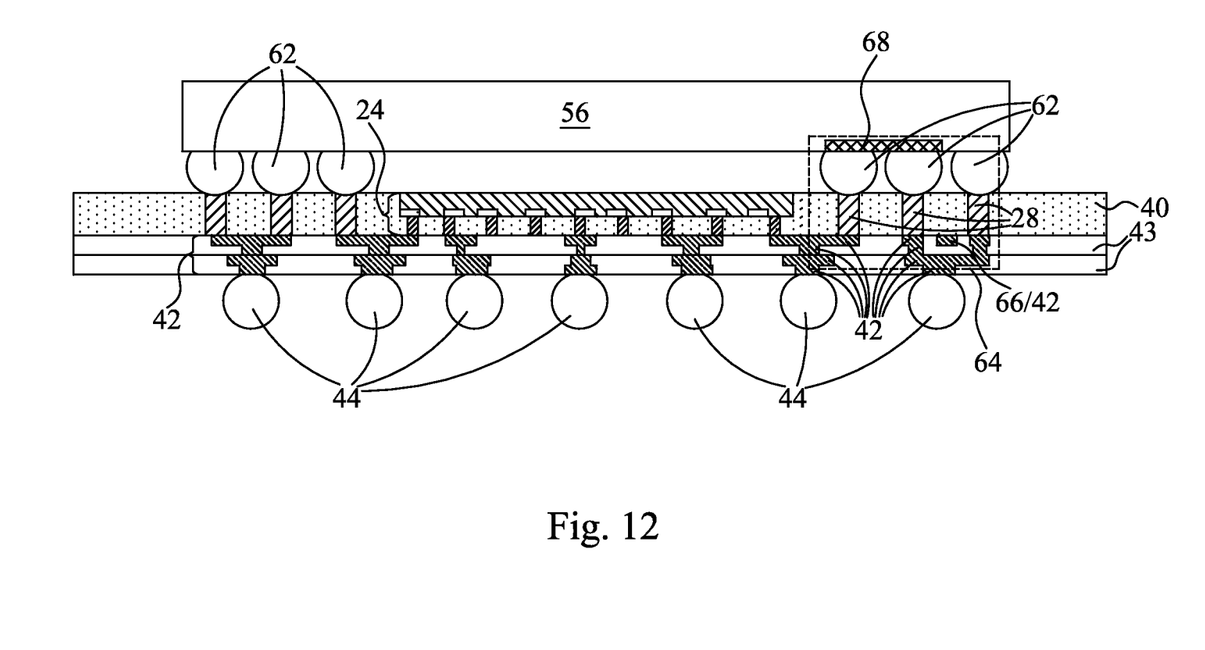

FIGS. 11 and 12 illustrate the cross-sectional views of intermediate stages in the formation of a PoP structure in accordance with alternative embodiments. Unless specified otherwise, the materials and formation methods of the components in these embodiments are essentially the same as like components denoted by like reference numerals in the embodiments shown in FIGS. 1 through 10. The details regarding the formation process and the materials of the components shown in FIGS. 11 through 12 may thus be found in the discussion of the embodiments shown in FIGS. 1 through 10.

The initial steps of these embodiments are essentially the same as shown in FIGS. 1 through 8. Next, as shown in FIG. 11, electrical connectors 62 are formed over polymer 40, and over and electrically coupled to TAVs 28. Electrical connectors 62 may be solder balls, metal pillars, composite connectors including metal pillars and overlying pre-solders, and the like. In FIG. 12, electrical connectors 62 are used to bond package component 56 to package 46.

Figure 13:
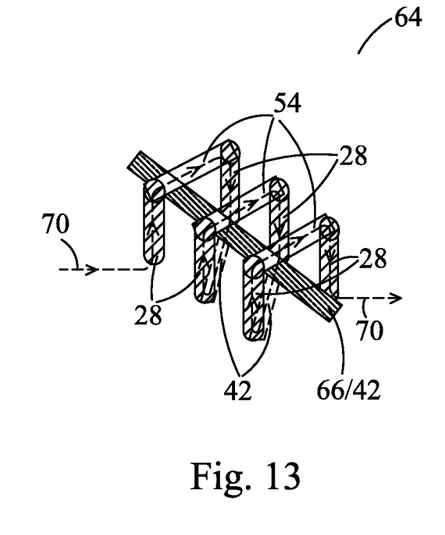
FIGS. 13 and 14 illustrate the perspective views of portions of the passive devices in the PoP structures that are shown in FIGS. 10 and 12, respectively.

FIG. 13 illustrates a perspective view of passive device 64, which is formed in the PoP structure shown in FIG. 10. In FIG. 10, passive device 64 is schematically illustrated, and the more detailed structure may be found referring to FIG. 13. Passive device 64 may be an inductor, a transformer, or the like. As shown in FIGS. 10 and 13, passive device 64 has a vertical structure including one or more layers of RDLs 42, TAVs 28, and one or more layers of RDLs 54, wherein RDLs 42 and 54 are formed on the opposite sides of polymer 40 and TAVs 28. TAVs 28 form the vertical portions of passive device 64, and have lengthwise directions perpendicular to back surface 24A of package component 24. RDLs 42 and 54 form the horizontal portions, and may also form some vertical portions, of passive device 64.

As shown in FIG. 13, passive device 64 may include a coil, wherein the axis (overlapped by line 66) of the coil is parallel to major surface 24A (FIG. 10) of device die 24. The respective passive device 64 is hence referred to as a vertical passive device. In some embodiments, paramagnetic line 66, which is a part of RDLs 42, is parallel to or overlaps the axis of the coil of passive device 64. In these embodiments, paramagnetic line 66 may comprise iron, cobalt, nickel, and combinations thereof. According, the respective layer of RDLs 42 is formed of the same material as paramagnetic line 66. The formation of paramagnetic line 66 may result in a significant improvement in the Q factor of passive device 64. In the exemplary embodiments shown in FIG. 10, paramagnetic line 66 is a part of RDLs 42. Alternatively, paramagnetic line 66 may be a part of RDLs 54.

Figure 14:
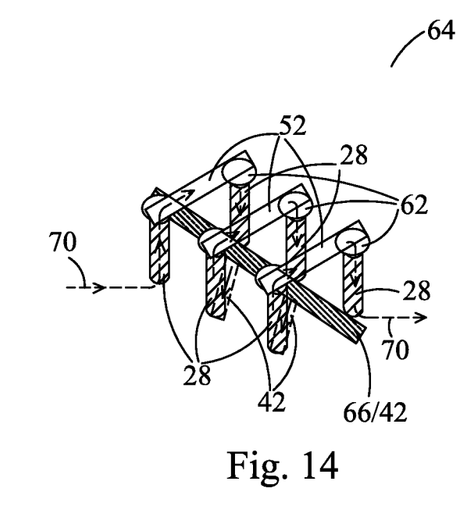

FIG. 14 illustrates a more detailed perspective view of passive device 64 that is formed in the PoP structure in FIG. 12. Passive device 64 in these embodiments includes both TAVs 28 and electrical connectors 62, which may be solder balls, for example. Conductive lines 68 (FIG. 12) that are in package component 56 form some horizontal parts of passive device 64. Conductive lines 68 may be built inside package component 56, or as surface lines of package component 56. In passive device 64, conductive lines 68, electrical connectors 62, TAVs 28, and RDLs 42 are coupled in series to form the coil of passive device 64.

Arrows 70 in FIGS. 13 and 14 schematically illustrate the currents during the operation of the respective passive devices 64. As indicated by arrows 70, each of passive devices 64 includes at least three of TAVs 28 that are connected in series, wherein the TAVs 28 form the vertical parts of the respective coils of passive device 64. Passive device 64 may also include four, five, six, or any greater number of TAVs 28 that are connected in series. Furthermore, as shown in FIG. 14, passive device 64 may include three, four, five, six, or any greater number of electrical connectors (solder balls, for example) 62 that are connected in series with TSVs 28.

In the embodiments, by forming vertical passive devices in PoP structures, the Q factors of the passive devices may be increased due to the fact that the vertical structures are suitable to enclose more space within the respective passive devices. Furthermore, the passive devices extend to opposite sides of polymer 40 (FIGS. 10 and 12), and possibly extend into top package component 56 (FIG. 12). As a result, the sizes of the passive devices may be increased without expanding the horizontal sizes of the resulting PoP structure. The increase of the sizes of the passive devices also results in the improvement in the inductance, for example, of the resulting inductors.

In accordance with embodiments, a device includes a polymer. A device die is disposed in the polymer. A passive device includes three TAVs penetrating through the polymer, wherein the three TAVs are coupled in series. An RDL is underlying the polymer. The RDL electrically couples a first one of the three TAVs to a second one of the three TAVs.

In accordance with other embodiments, a device includes a device die, which includes a plurality of metal features at a first surface. A molding compound has the device die molded therein, wherein the molding compound has a top surface level with a second surface of the device die, and a bottom surface level with ends of the plurality of metal features. A passive device includes a coil, wherein the coil includes a plurality of TAVs penetrating through the molding compound. A plurality of RDLs is underlying the molding compound, wherein the plurality of RDLs and the plurality of TAVs are electrically coupled in series.

In accordance with yet other embodiments, a method includes placing a device die over a carrier, forming a plurality of TAVs over the carrier, and molding the device die and the plurality of TAVs in a polymer. The polymer is then thinned. After the step of thinning, ends of the TAVs are level with ends of conductive features of the device die, wherein the ends of the TAVs and the ends of the conductive features are exposed through a surface of the polymer. A plurality of RDLs is formed on a side of the polymer, wherein the plurality of RDLs is electrically coupled to the plurality of TAVs. The method further includes interconnecting the plurality of TAVs using a plurality of conductive lines to form a passive device. The plurality of conductive lines and the first plurality of RDLs are on opposite sides of the polymer. The passive device includes the plurality of TAVs and one of the RDLs. The plurality of conductive lines for interconnecting the plurality of TSVs may be formed on the polymer or located inside a package component.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a polymer;
a device die in the polymer; and
a passive device comprising:
three Through Assembly Vias (TAVs) penetrating through the polymer, wherein the three TAVs are coupled in series; and
a first Redistribution Line (RDL) underlying the polymer, wherein the first RDL electrically couples a first one of the three TAVs to a second one of the three TAVs.

2. The device of claim 1, wherein the three TAVs comprise:
top ends level with a top surface of the polymer; and
bottom ends level with ends of metal posts of the device die.

3. The device of claim 1, wherein the polymer comprises a molding compound.

4. The device of claim 1, wherein the passive device further comprises a second RDL over the polymer, wherein the second RDL electrically couples the second one of the three TAVs to a third one of the three TAVs.

5. The device of claim 1, wherein the passive device further comprises three solder regions, each being overlying and electrically coupled to one of the three TAVs, and wherein the three solder regions and the three TAVs are coupled in series.

6. The device of claim 1, wherein the passive device comprises a coil, and wherein an axis of the coil is parallel to a back surface of the device die.

7. The device of claim 6, wherein the passive device further comprises a paramagnetic line parallel to the axis of the coil, and wherein the paramagnetic line comprises a paramagnetic material.

8. The device of claim 1, wherein the passive device comprises an inductor.

9. A device comprising:
a device die comprising a plurality of metal features at a first surface of the device die;
a molding compound with the device die molded therein, wherein the molding compound comprises:
a top surface level with a second surface of the device die; and
a bottom surface level with ends of the plurality of metal features; and
a passive device comprising a coil, wherein the coil comprises:
a plurality of Through Assembly Vias (TAVs) penetrating through the molding compound; and
a first plurality of Redistribution Lines (RDLs) underlying the molding compound, wherein the first plurality of RDLs is electrically coupled in series with each other, and wherein the plurality of TAVs is electrically coupled in series with each other, and the plurality of TAVs is serially electrically coupled to the plurality of RDLs.

10. The device of claim 9, wherein the plurality of TAVs comprises:
first ends level with the top surface of the molding compound; and
second ends level with the bottom surface of the molding compound.

11. The device of claim 9, wherein the passive device further comprises a second plurality of RDLs over the molding compound, and wherein the second plurality of RDLs electrically inter-couples the second plurality of TAVs.

12. The device of claim 9, wherein the first plurality of RDLs is underlying an entirety of the molding compound.

13. The device of claim 9, wherein the passive device further comprises a plurality of solder regions, wherein each of the plurality of solder regions is over and electrically coupled to one of the plurality of TAVs, and wherein the plurality of solder regions is coupled in series, and the plurality of TAVs is electrically coupled in series with the plurality of solder regions.

14. The device of claim 9, wherein an axis of the coil is parallel to a major surface of the device die.

15. The device of claim 14, wherein the passive device further comprises a paramagnetic line parallel to the axis of the coil, and wherein the paramagnetic line comprises a paramagnetic material.

16. A device comprising:
a molding compound;
a plurality of Through Assembly Vias (TAVs) penetrating through the molding compound;
a first plurality of redistribution lines on a first side of the molding compound; and
a second plurality of redistribution lines on a second side of the molding compound opposite the first side, wherein the plurality of TAVs is electrically coupled in series with each other, the first plurality of redistribution lines is electrically coupled in series with each other, and the second plurality of redistribution lines is connected in series with each other to form a passive device.

17. The device of claim 16, wherein the passive device comprises a coil.

18. The device of claim 17 further comprising an additional redistribution line penetrating through the coil, with the coil wrapping around the additional redistribution line.

19. The device of claim 18, wherein the plurality of TAVs is distributed on opposite sides of the additional redistribution line.

20. The device of claim 16 further comprising a plurality of solder regions electrically coupled in series with each other, and the plurality of solder regions is electrically coupled in series to the plurality of TAVs, the first plurality of redistribution lines, and the second plurality of redistribution lines to form the passive device.

* * * * *